United States Patent
Itoh et al.

(10) Patent No.: US 6,297,152 B1
(45) Date of Patent: *Oct. 2, 2001

(54) CVD PROCESS FOR DCS-BASED TUNGSTEN SILICIDE

(75) Inventors: Toshio Itoh, Palo Alto; Mei Chang, Saratoga, both of CA (US)

(73) Assignee: Applied Materials, Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/764,471

(22) Filed: Dec. 12, 1996

(51) Int. Cl.[7] .................. H01L 21/44; H01L 21/4763
(52) U.S. Cl. .................. 438/649; 438/583; 438/647; 438/648; 438/680; 438/683
(58) Field of Search .................. 438/683, 679, 438/680, 655, 649, 583, 647, 648; 427/255.1, 238, 255.2, 255.7, 237, 578, 576, 583, 124

(56) References Cited

U.S. PATENT DOCUMENTS

| | | | |
|---|---|---|---|
| 4,751,101 | 6/1988 | Joshi | 427/39 |
| 4,985,371 | 1/1991 | Rana et al. | 437/189 |
| 5,334,552 | 8/1994 | Homma | 437/195 |
| 5,356,673 | 10/1994 | Schmitt et al. | 427/446 |
| 5,369,300 | 11/1994 | Heideman et al. | 257/651 |
| 5,391,394 | 2/1995 | Hansen | 427/124 |
| 5,429,991 * | 7/1995 | Iwasaki et al. | 438/653 |
| 5,433,975 | 7/1995 | Roberts et al. | 427/253 |
| 5,482,749 | 1/1996 | Telford et al. | 427/578 |
| 5,500,249 | 3/1996 | Telford et al. | 427/255 |
| 5,558,910 | 9/1996 | Telford et al. | 427/255 |
| 5,874,360 * | 2/1999 | Wyborn et al. | 438/680 |

OTHER PUBLICATIONS

T. Hara et al., "Composition of Tungsten Silicide Films Deposited by Dichlorosilane Reduction of Tungsten Hexafluoride," *J. Electrochem. Soc.,* vol. 137, No. 9, pp. 2955–2959 (Sep. 1990).

S.G. Telford et al., "Chemically Vapor Deposited Tungsten Silicide Films Using Dichlorosiline in a Single–Wafer Reactor," *J. Electrochem. Soc.,* vol. 140, No. 12, pp. 3689–3701 (Dec. 1993).

J.S. Byun et al., "Characterization of the Dopant Effect on Dichlorosilane–Based Tungsten Silicide Deposition," *J. Electrochem. Soc.,* vol. 144, No. 10, pp. 3572–3582 (Oct. 1997).

J.B. Price et al., Low Pressure CVD of Tungsten and Tungsten Disilicide, *Semicon. West,* pp. 157–166 (1986).

S.C. Selbrede, "CVD of Tungsten Silicide Using Dichlorosilane," *Semiconductor International.,* pp. 88–92 (Aug. 1988).

T. Hara et al., Deposition of Tungsten Silicide Films by the Chemical Vapor Reaction of Dichlorosilane and Tungsten-hexafluoride, *Japanese Journal of Applied Physics,* vol. 27, No. 10 pp. L1812–L1814 (Oct. 1988).

(List continued on next page.)

Primary Examiner—John F. Niebling
Assistant Examiner—Ha Tran Nguyen
(74) Attorney, Agent, or Firm—Townsend and Townsend and Crew, LLP (57) ABSTRACT

A multiple step chemical vapor deposition process for depositing a tungsten silicide layer on a substrate. A first step of the deposition process includes a pretreatment step in which $WF_6$ is introduced into a deposition chamber. Next, the introduction of $WF_6$ is stopped and a silicon-containing gas, e.g., $SiH_4$, is introduced into the chamber. Finally, during a third step, the $SiH_4$ flow is stopped and DCS and $WF_6$ are introduced into the chamber to deposit a tungsten silicide layer on the substrate.

37 Claims, 8 Drawing Sheets

OTHER PUBLICATIONS

T.H. Tom Wu et al., Properties of $WSi_x$ Using Dichlorosilane in a Single–Wafer System, *J. Vac. Sci. Technol. B.,* vol. 6, No. 6 pp. 1707–1713 (Nov. Dec. 1988).

R.B. Gregory et al., "RBS and SIMS Characterization of Tungsten Silicide Deposited by Using Dichlorosilane and Tungsten Hexafluoride," *Surface and Interface Analysis,* vol. 14, pp. 13–17 (1989).

T. Hara et al., "Tungsten Silicide Films Deposited by $SiH_2Cl_2$–$WF_6$ Chemical Reaction," *J. Electrochem. Soc.,* vol. 136, No. 4 (Apr. 1989).

* cited by examiner

CVD PROCESS FOR DCS-BASED TUNGSTEN SILICIDE

BACKGROUND OF THE INVENTION

The present invention relates to the fabrication of integrated circuits. More particularly, the invention provides a technique, including a method and apparatus, for forming improved tungsten silicide ($WSi_x$) films.

As advances in integrated circuit technology lead to a scaling down of device dimensions and an increase in chip size and complexity, closely spaced interconnection lines that have smaller cross-sectional areas than lines previous used are required. The small cross-sectional area of these interconnection lines results in increased generation of resistive heat, while the close spacing of the lines results in less heat dissipation. This combination of more resistive heat generation and less heat dissipation can cause high temperatures which can result in part failure. Also, the higher resistivity increases the RC time constant and thus affects the delay time of the circuit. Low delay times are desirable for high speed circuits.

Figure 1A:
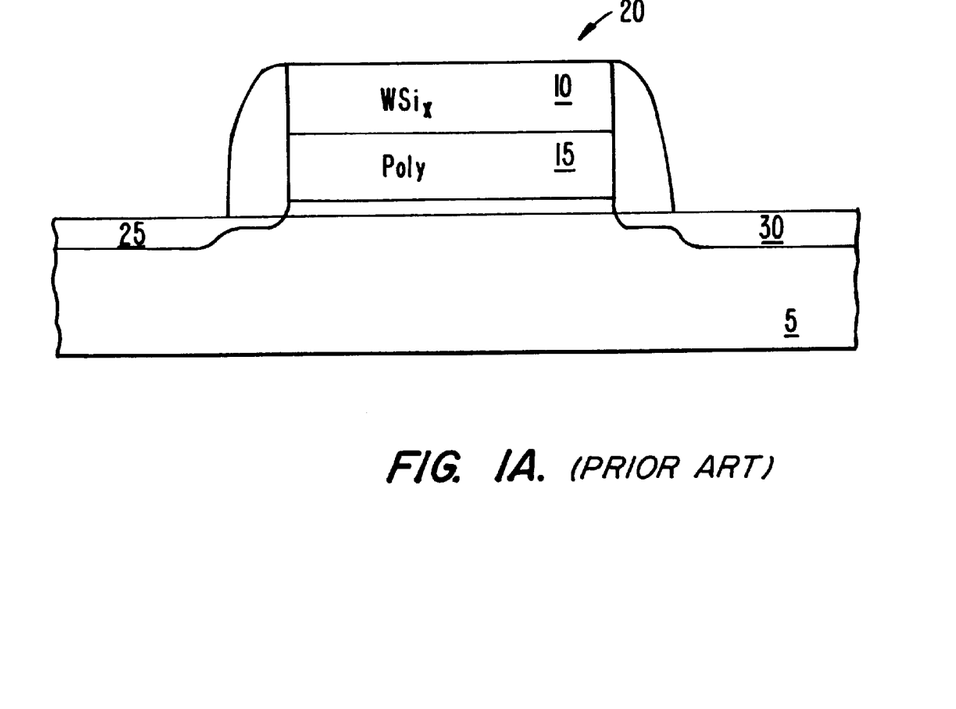
FIGS. 1A and 1B are simplified cross-sectional diagrams of integrated circuits that incorporate $WSi_x$ layers.
Figure 1B:
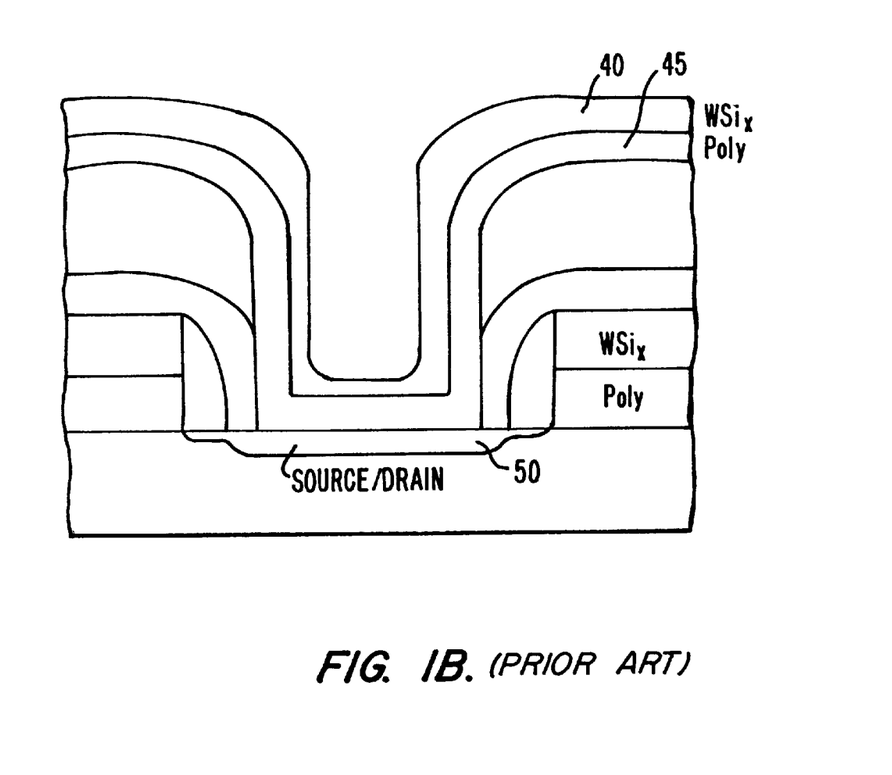

To overcome this problem, refractory metal silicide films having lower resistivities than polysilicon films were developed for use in these improved integrated circuits. Such metal silicide films result in circuits having lower delay times and less heat generation within the circuit. For gate metallizations, a low resistivity tungsten silicide film is deposited on top of a layer of polycrystalline silicon (polysilicon), to form a layered structure called a "polycide" structure. Two examples of such polycide structures are shown in FIGS. 1A and 1B. In FIG. 1A, a $WSi_x$ film 10 is deposited over a polysilicon film 15 to form a gate structure 20 that is part of a field effect transistor. The transistor is fabricated on a silicon substrate 5 and also includes source and drain regions 25 and 30. In FIG. 1B, a $WSi_x$ film 40 is deposited over a polysilicon layer 45 as part of a contact structure to source/drain region 50.

Many methods of forming $WSi_x$ layers exist. For example, one common technique creates a $WSi_x$ layer from a thermal reaction of monosilane ($SiH_4$) (also referred to herein as "MS") and tungsten hexafluoride ($WF_6$). Another method reacts dichlorosilane ($SiH_2Cl_2$) (hereinafter referred to as "DCS") with $WF_6$. Some DCS-based $WSi_x$ processes exhibit better step coverage, lower stress and lower fluorine content than monosilane processes and are thus preferred over MS-based processes for some applications. Despite their improved film characteristics, however, DCS-based $WSi_x$ processes are not without problems.

Figure 2A:
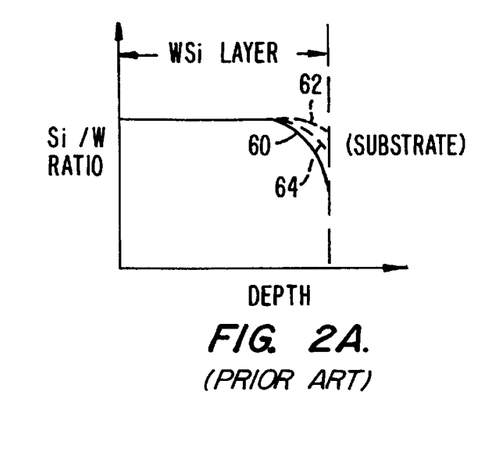
FIG. 2A is a graph showing the silicon to tungsten ratio of $WSi_x$ films deposited according to prior art processes.

One problem with DCS-based processes concerns getting the film to form on the substrate. Unless certain nucleation steps are used, it is difficult to grow a $WSi_x$ film from DCS and $WF_6$ in some applications. Another problem with DCS-based processes is the tendency for the deposited films to be tungsten-rich in the initial stages of deposition (i.e., near the interface of the $WSi_x$ film being deposited and the substrate or other layer that the $WSi_x$ film is deposited over—this area is often referred to as the "interfacial region"). This problem is illustrated in FIG. 2A, which is a graph of the ratio of silicon to tungsten in some prior art DCS $WSi_x$ films. As shown in FIG. 2A, the ratio of silicon to tungsten (line 60) can decrease significantly in some prior art DCS $WSi_x$ layers near the film interface. The formation of such an interfacial tungsten rich strata can result in delamination of the $WSi_x$ layer during annealing of the fully processed wafer in the final stages of processing. Also, voids may be created by the migration of silicon atoms from an underlying polysilicon layer to the silicon deficient $WSi_x$ layer. Such silicon migration can adversely affect device performance.

Still another problem with DCS-based $WSi_x$ films is that there can be a variance in the sheet resistance of deposited films in some instances as explained below. In depositing DCS $WSi_x$ films, it is common to process n wafers (n is between 15–25 in some processes) and then initiate a chamber clean step, which removes $WSi_x$ build-up from the interior walls of the chamber, before the next batch of n wafers are processed. It is also common to "season" the chamber after the clean step before processing the n wafers. Seasoning is done by depositing a thin layer of $WSi_x$ within the chamber without a substrate present. This seasoning layer covers contaminants and residue that may remain on chamber walls after the clean step and helps prevents these contaminants from interfering with subsequent $WSi_x$ deposition steps. An example of such a seasoning step is described in U.S. Pat. No. 5,482,749, assigned to Applied Materials.

Figure 2B:
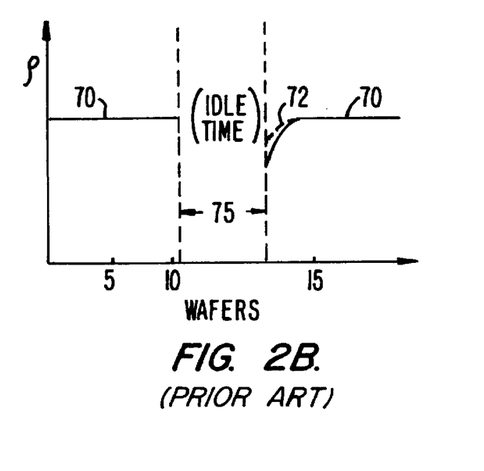
FIG. 2B is a graph of sheet resistivity in $WSi_x$ films deposited according to prior art processes.

A variance in sheet resistance occurs if, for example, during the processing of the n substrates, the deposition chamber is left idle (i.e., not processing a substrate) for a period of time. This problem is illustrated in FIG. 2B, where line 70 is the resistivity ($\rho$) of $WSi_x$ films deposited over successive wafers after clean and seasoning steps. As shown in FIG. 2B, the first couple of $WSi_x$ layers deposited on substrates processed after an idle period 75 (which may occur, for example, because of a system fault) have a lower resistivity than subsequent and previously deposited layers. This problem has been referred to as the "idle effect."

One step that some manufacturers have taken to increase the Si/W ratio in the interfacial region and to reduce the idle effect is to employ a monosilane treatment step (also referred to as an "MS soak") before the $WSi_x$ nucleation and deposition steps. In the MS soak step, $SiH_4$ introduced into the chamber to provide additional silicon for the subsequent $WSi_x$ deposition. The MS soak step is described in more detail in U.S. Pat. No. 5,817,576 and assigned to Applied Materials, the assignee of the present invention. The Ser. No. 08/314,161 application is hereby incorporated by reference for all purposes.

$WSi_x$ films deposited with such a MS soak step as a stage of the deposition process have an improved Si/W ratio in the interfacial layer and exhibit less of a variance in resistivity when the layers are deposited over substrates processed after an idle time. For example, the variance in resistivity is decreased (FIG. 2B, dashed line 72) with $WSi_x$ layers deposited after the MS soak step. Also, for applications in which the $WSi_x$ layer is deposited over an undoped or lightly-doped polysilicon layer, the Si/W ratio in films deposited with the MS soak step is improved as shown by line 62 in FIG. 2A. These $WSi_x$ films are sufficient for many applications.

While these improvements are significant, still more improvements are desirable for other applications. For example, the MS soak step is less effective at improving the Si/W ratio in $WSi_x$ films deposited over phosphorus-doped polysilicon (shown in FIG. 2A, dashed line 64). In such a case, it is believed that phosphorous from the doped polysilicon has a catalytic effect on the decomposition of subsequently introduced $WF_6$. Thus, when $WSi_x$ films are deposited on phosphorus heavily-doped polysilicon (e.g., polysilicon having a phosphorus concentration of about $2.0 \times 10^{20}$ atoms/cm$^3$), a tungsten-rich interfacial layer is more easily formed. Also, while improved, the variance in resistivity due to the idle effect is still too much for some very small feature size processes. In these processes, the chamber was previously reseasoned after an idle period to avoid such a variance.

Accordingly, improvements in the deposition of $WSi_x$ films and in the deposition of DCS-based $WSi_x$ films in particular are desirable and are being continuously sought.

SUMMARY OF THE INVENTION

The present invention provides a method and apparatus for forming an improved $WSi_x$ layer. The method of the present invention is particularly applicable to DCS-based $WSi_x$ applications, but may find use in other $WSi_x$ deposition methods also.

Tungsten silicide films deposited according to the present invention have an improved Si/W ratio at the film interface. The improvement in Si/W ratio is achieved in a manner that is counterintuitive to what persons of ordinary skill in the art would think would work and was found to work only when the present inventors tried the approach in an effort to solve a different problem unrelated to either the Si/W ratio or idle effect. While the method the inventors devised did not work to solve the original problem, the inventors found that films deposited with the method have an improved Si/W ratio at the interface even when the $WSi_x$ layer is deposited over a silicon substrate heavily doped with a dopant such as phosphorus. The inventors also found that the present invention significantly reduced variances in sheet resistivity due to the idle effect.

The present invention is directed toward a $WSi_x$ layer having a fluorine content of less than $1\times10^{18}$ atoms/cm$^3$, and preferably less than $1\times10^{17}$ atoms/cm$^3$. Depending on the application the $WSi_x$ layer is used for, it is common for the layer to be deposited between a thickness of 500 to 2000 Å thick. Using the method of the present invention it is possible to obtain a high degree of control over the silicon to tungsten ratio of the $WSi_x$ film. Preferably, $WSi_x$ layers deposited according to the present invention exhibit a substantially uniform silicon to tungsten ratio throughout the entire thickness of the $WSi_x$ layer. By "substantially uniform" it is meant that the average silicon to tungsten ratio within each strata of the $WSi_x$ layer is between ±10% of the average bulk value of the ratio through the thickness of the $WSi_x$ layer. Typically, the average bulk value of the ratio of silicon to tungsten is between 2.0 to 2.8. More preferably, the average value is between 2.2 and 2.6. The $WSi_x$ layer can be deposited in such a substantially uniform manner over doped or undoped polysilicon layers, doped or undoped silicon substrates and doped or undoped silicon oxide or other layers.

In one embodiment, the $WSi_x$ film is deposited using a multiple step chemical vapor deposition process. A first step of the deposition process includes a pretreatment step in which $WF_6$ is introduced into a deposition chamber. Next, the introduction of $WF_6$ is stopped and a silicon-containing gas, e.g., $SiH_4$, is introduced into the chamber. Finally, during a third step, the $SiH_4$ flow is stopped and DCS and $WF_6$ are introduced into the chamber to deposit a tungsten silicide layer on the substrate.

These and other embodiments of the present invention, as well as its advantages and features are described in more detail in conjunction with the text below and attached figures.

DETAILED DESCRIPTION OF THE PREFERRED EMBODIMENTS

I. Introduction

The present invention allows for deposition of an improved tungsten silicide film by introducing a tungsten containing gas, such as $WF_6$, into the deposition chamber as a pretreatment step before deposition of the $WSi_x$ layer. Films deposited by the method of the present invention are suitable for use in the fabrication of integrated circuits having feature sizes of 0.35 microns or less. Also, the present invention can be used to deposit $WSi_x$ films in CVD chambers of conventional design.

II. Exemplary CVD Reactor Chamber

Figure 3A:
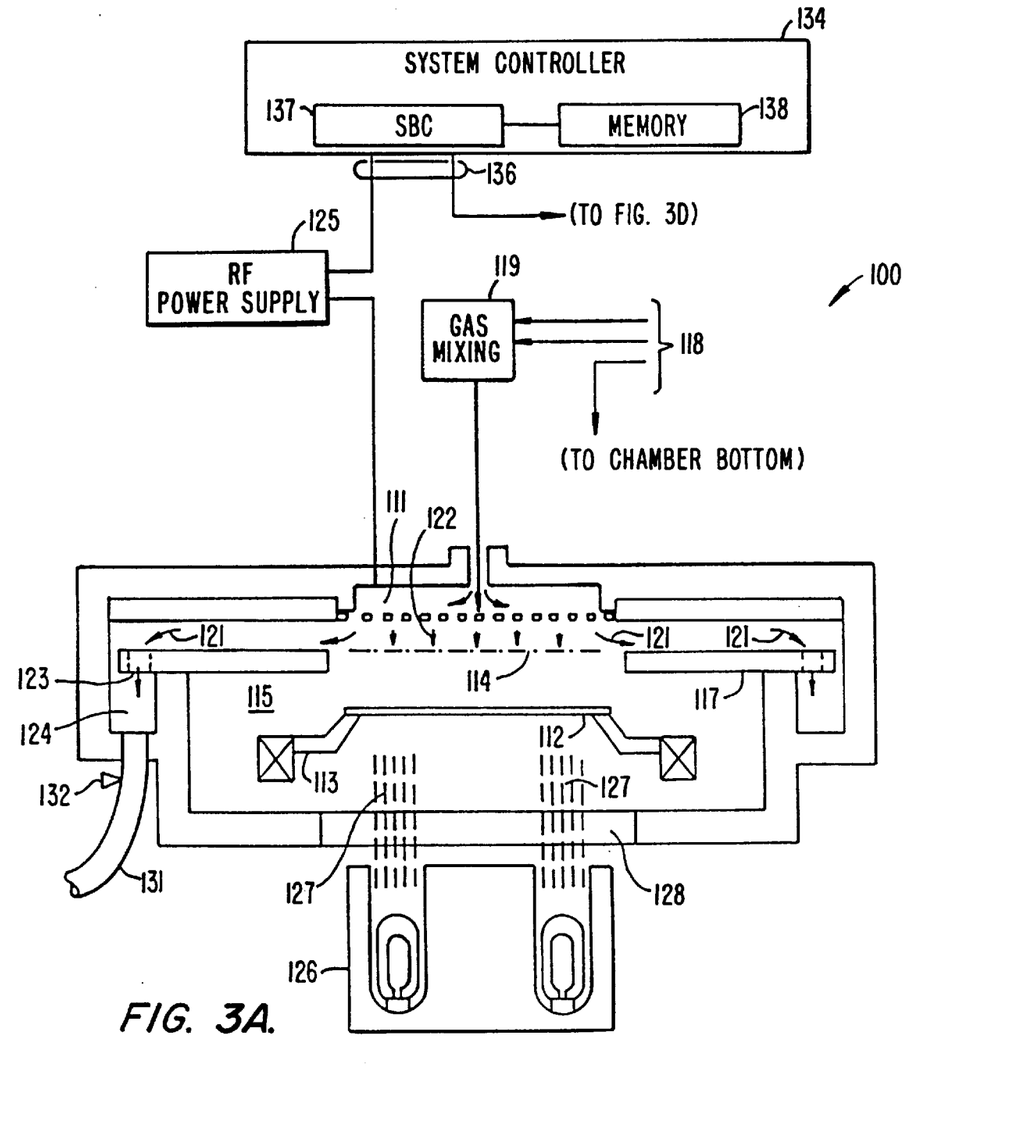
FIG. 3A is a vertical, cross-sectional view of one embodiment of a simplified chemical vapor deposition apparatus according to the present invention.

FIG. 3A illustrates one embodiment of a simplified, parallel-plate chemical vapor deposition (CVD) system 100 having a vacuum chamber 115 in which the tungsten silicide layer according to the present invention can be deposited. CVD system 100 contains a gas distribution manifold 111 for dispersing process gases through perforated holes in manifold 111 to a wafer (not shown) that rests on a susceptor 112 in a deposition zone of the chamber. Susceptor 112 is highly thermally responsive and is mounted on supports 113 so that susceptor 112 (and the wafer supported on the upper surface of susceptor 112) can be controllably moved between a lower loading/off-loading position and an upper processing position 114 which is closely adjacent to manifold 111. A center board (not shown) includes sensors for providing information on the position of the wafer.

When susceptor 112 and the wafer are in processing position 114, they are surrounded by a baffle plate 117 having a plurality of spaced holes 123 which exhaust into an annular vacuum manifold 124. Deposition and carrier gases are supplied through supply lines 118 into a mixing system 119 where they are combined and then sent to manifold 111. It is also possible, and desirable in some instances, to direct deposition and carrier gases directly from lines 118 to manifold 111. In such a case, gas mixing system 119 is bypassed.

Figure 3B:
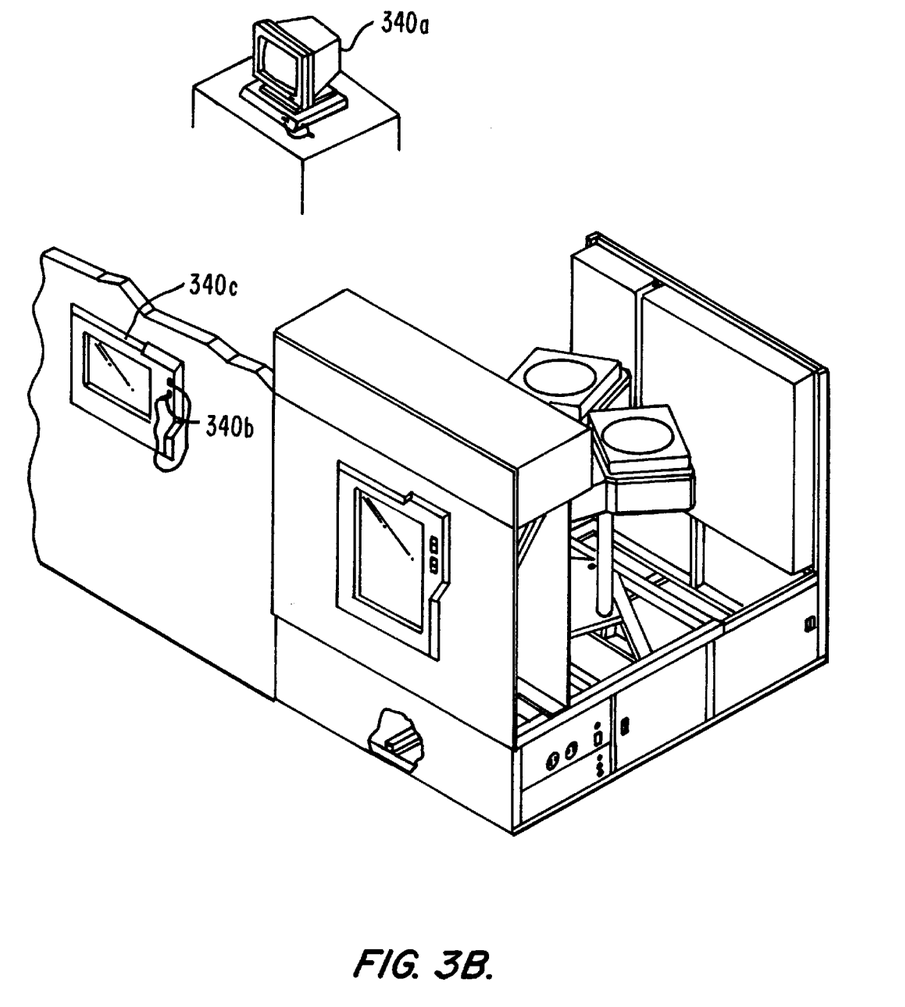
FIG. 3B is a simplified diagram of system monitor and CVD system 100 in a multi-chamber system, which may include one or more chambers.
Figure 3C:
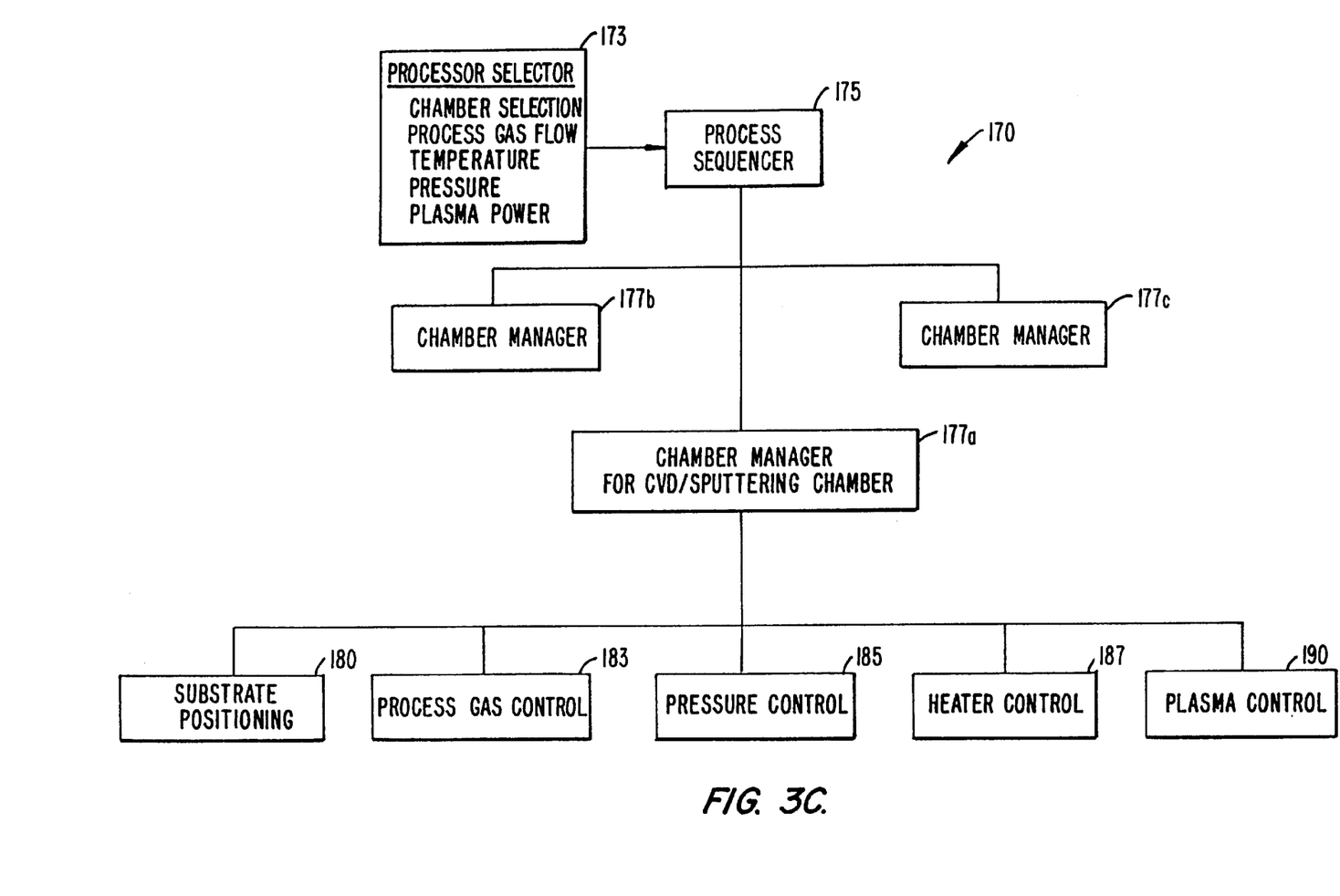
FIG. 3C shows an illustrative block diagram of the hierarchical control structure of the system control software, computer program 170, according to a specific embodiment.
Figure 3D:
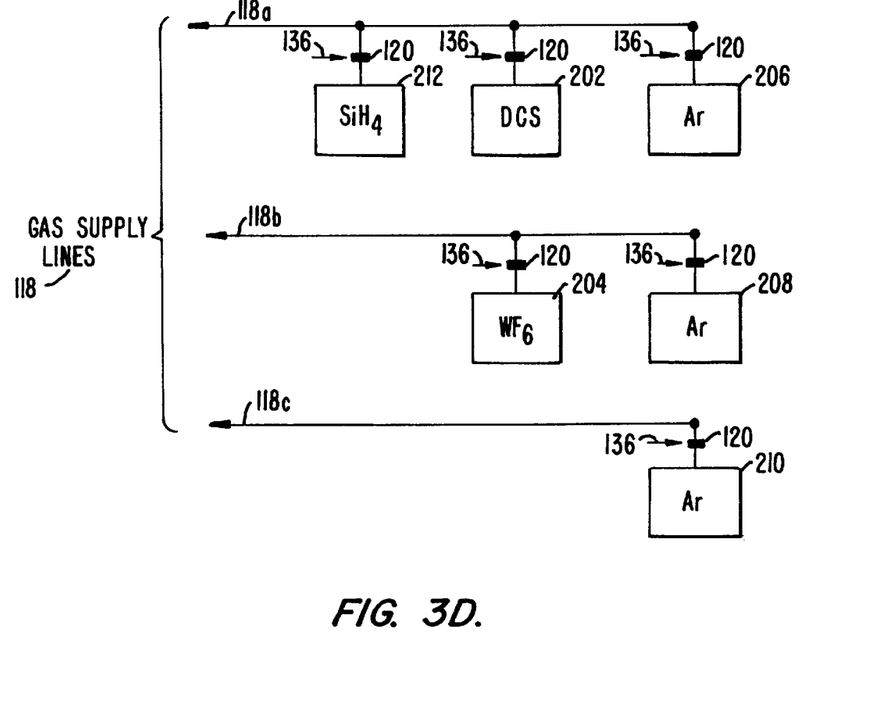
FIG. 3D is a simplified diagram showing various gas supplies connected to gas supply lines 118(a)–118(c) of FIG. 3A.

As shown in FIG. 3D, there are three gas supply lines 118 in all. A first line (118a) supplies a silicon containing gas (e.g., DCS from a DCS source 202) into gas mixing system 119, while a second line (118b) supplies $WF_6$ from a $WF_6$ source 204 into the mixing system. For each line 118a and 118b, a carrier gas (e.g. argon from argon source 206 and 208) can be supplied with the process to stabilize gas flows as appropriate and to even the gas flow between the two lines into the mixing system. Such mixing of gases (DCS and $WF_6$) upstream of chamber 115 is believed to result in more uniform gas distribution into the chamber thereby resulting in greater uniformity in the deposited $WSi_x$ film. A third gas supply line 118(c) introduces an inert purge gas (e.g., argon from an argon source 210) from the bottom of the chamber to keep deposition gases away from the area of the chamber below susceptor 112. In preferred embodiments, an additional silicon source (e.g., silane) may be supplied from additional gas source 212.

Generally, supply lines 118 for each of the process gases include (i) safety shut-off valves (not shown) that can be used to automatically or manually shut off the flow of process gas into the chamber, and (ii) mass flow controllers 120 that measure the flow of gas or liquid through the supply lines. When toxic gases are used in the process, the several safety shut-off valves are positioned on each gas supply line in conventional configurations. The rate at which deposition and carrier gases are supplied to gas mixing system 119 is controlled by liquid or gas mass flow controllers 120 and/or by valves. During processing, gas supplied to manifold 111 is vented toward and uniformly distributed radially across the surface of the wafer in a laminar flow as indicated by arrows 121. An exhaust system then exhausts the gas via ports 123 into the circular vacuum manifold 124 and out an exhaust line 131 by a vacuum pump system (not shown). The rate at which gases are released through exhaust line 131 is controlled by a throttle valve 132.

A deposition or subsequent cleaning process performed in CVD system 100 can be either a thermal process or a plasma-enhanced process. In a plasma process, a controlled plasma is formed adjacent to the wafer by RF energy applied to manifold 111 from RF power supply 125. Manifold 111 is also an RF electrode, while susceptor 112 is grounded. RF power supply 125 can supply either single or mixed frequency RF power (or other desired variation) to manifold 111 to enhance the decomposition of reactive species introduced into chamber 115.

Heat is distributed by an external lamp module 126. External lamp heater module 126 provides a collimated annular pattern of light 127 through a quartz window 128 onto an annular outer peripheral portion of susceptor 112. Such heat distribution compensates for the natural heat loss pattern of the susceptor and provides rapid thermal and uniform susceptor and wafer heating for effecting deposition.

Typically, any or all of the chamber lining, gas distribution manifold faceplate, supports 113, and various other reactor hardware is made out of material such as aluminum or anodized aluminum. An example of such a CVD apparatus is described in U.S. Pat. No. 5,000,113 entitled "Thermal CVD/PECVD Reactor and Use for Thermal Chemical Vapor Deposition of Silicon Dioxide and In situ Multi-step Planarized Process," issued to Chang et al. and assigned to Applied Materials, Inc., the assignee of the present invention, which is incorporated herein by reference for all purposes.

A motor (not shown) raises and lowers susceptor 112 between a processing position 114 and a lower, wafer-loading position. Motors and optical sensors are used to move and determine the position of movable mechanical assemblies such as throttle valve 132 and susceptor 112. The heater, motors, valves or flow controllers 120 connected to supply lines 118, gas delivery system, throttle valve 132, RF power supply 125, and lamp magnet drivers are all controlled by a system controller 134 over control lines 136 of which only some are shown.

System controller 134 controls all of the activities of the CVD machine. The system controller executes system control software, which is a computer program stored in a computer-readable medium such as a memory 138. Preferably, memory 138 may be a hard disk drive, but memory 138 may also be other kinds of memory. The computer program includes sets of instructions that dictate the timing, mixture of gases, chamber pressure, chamber temperature, RF power levels, susceptor position, and other parameters of a particular process. Of course, other computer programs such as one stored on another memory device including, for example, a floppy disk or other another appropriate drive, may also be used to operate processor 134.

In a preferred embodiment, the system controller includes a hard disk drive (memory 138), a floppy disk drive and a card rack. The card rack contains a single board computer (SBC) processor 137, analog and digital input/output boards, interface boards and stepper motor controller boards. Various parts of CVD system 100 conform to the Versa Modular Europeans (VME) standard which defines board, card cage, and connector dimensions and types. The VME standard also defines the bus structure having a 16-bit data bus and 24-bit address bus.

The interface between a user and processor 134 is via a CRT monitor 150a and light pen 150b, shown in FIG. 3B which is a simplified diagram of the system monitor and CVD system 100 in a multi-chamber system, which may include one or more chambers. In the preferred embodiment two monitors 150a are used, one mounted in the clean room wall for the operators and the other behind the wall for the service technicians. Both monitors 150a simultaneously display the same information, but only one light pen 150b is enabled. The light pen 150b detects light emitted by CRT display with a light sensor in the tip of the pen. To select a particular screen or function, the operator touches a designated area of the display screen and pushes the button on the pen 150b. The touched area changes its highlighted color, or a new menu or screen is displayed, confirming communication between the light pen and the display screen. Of course, other devices, such as a keyboard, mouse, or other pointing or communication device, may be used instead of or in addition to light pen 150b to allow the user to communicate with processor 134.

The process for depositing the film can be implemented using a computer program product that is executed by processor 134. The computer program code can be written in any conventional computer readable programming language, such as, 68000 assembly language, C, C++, Pascal, Fortran, or others. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled windows library routines. To execute the linked compiled object code, the system user invokes the object code, causing the computer system to load the code in memory, from which the CPU reads and executes the code to perform the tasks identified in the program.

FIG. 3C shows an illustrative block diagram of the hierarchical control structure of the system control software, computer program 170, according to a specific embodiment. A user enters a process set number and process chamber number into a process selector subroutine 173 in response to menus or screens displayed on the CRT monitor by using the light pen interface. The process sets are predetermined sets of process parameters necessary to carry out specified processes, and are identified by predefined set numbers. The process selector subroutine 173 identifies (i) the desired process chamber, and (ii) the desired set of process parameters needed to operate the process chamber for performing the desired process. The process parameters for performing a specific process relate to process conditions such as, for example, process gas composition and flow rates, temperature, pressure, RF power levels and chamber wall temperature among others are provided to the user in the form of a recipe. The parameters specified by the process recipe are entered utilizing the light pen/CRT monitor interface.

The signals for monitoring the process are provided by the analog input and digital input boards of the system controller and the signals for controlling the process are output on the analog output and digital output boards of CVD system 100.

A process sequencer subroutine 175 comprises program code for accepting the identified process chamber and set of process parameters from the process selector subroutine 173, and for controlling operation of the various process chambers. Multiple users can enter process set numbers and process chamber numbers, or a user can enter multiple process set numbers and process chamber numbers, so the sequencer subroutine 175 operates to schedule the selected processes in the desired sequence. Preferably the sequencer subroutine 175 includes a program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling which process is to be executed, the sequencer subroutine 175 can be designed to take into consideration the present condition of the process chamber being used in comparison with the desired process conditions for a selected process, or the "age" of each particular user entered request, or any other relevant factor a system programmer desires to include for determining scheduling priorities.

Once the sequencer subroutine 175 determines which process chamber and process set combination is going to be executed next, the sequencer subroutine 175 causes execution of the process set by passing the particular process set parameters to a chamber manager subroutine 177a–c which controls multiple processing tasks in a process chamber 115 according to the process set determined by the sequencer subroutine 175. For example, the chamber manager subroutine 177a comprises program code for controlling CVD process and plasma cleaning process operations in the process chamber 115. The chamber manager subroutine 177 also controls execution of various chamber component subroutines which control operation of the chamber components necessary to carry out the selected process set. Examples of chamber component subroutines are substrate positioning subroutine 180, process gas control subroutine 183, pressure control subroutine 185, heater control subroutine 187, and plasma control subroutine 190. Those having ordinary skill in the art would readily recognize that other chamber control subroutines can be included depending on what processes are desired to be performed in the process chamber 115. In operation, the chamber manager subroutine 177a selectively schedules or calls the process component subroutines in accordance with the particular process set being executed. The chamber manager subroutine 177a schedules the process component subroutines similarly to how the sequencer subroutine 175 schedules which process chamber 115 and process set is to be executed next. Typically, the chamber manager subroutine 177a includes steps of monitoring the various chamber components, determining which components needs to be operated based on the process parameters for the process set to be executed, and causing execution of a chamber component subroutine responsive to the monitoring and determining steps.

Operation of particular chamber component subroutines will now be described with reference to FIG. 3C. The substrate positioning subroutine 180 comprises program code for controlling chamber components that are used to load the substrate onto the susceptor 112, and optionally to lift the substrate to a desired height in the chamber 115 to control the spacing between the substrate and the gas distribution manifold 111. When a substrate is loaded into the process chamber 115, the susceptor 112 is lowered to receive the substrate, and thereafter, the susceptor 112 is raised to the desired height in the chamber, to maintain the substrate at a first distance or spacing from the gas distribution manifold during the CVD process. In operation, the substrate positioning subroutine 180 controls movement of the susceptor in response to process set parameters related to the support height that are transferred from the chamber manager subroutine 177a.

The process gas control subroutine 183 has program code for controlling process gas composition and flow rates. The process gas control subroutine 183 controls the open/close position of the safety shut-off valves, and also ramps up/down the mass flow controllers to obtain the desired gas flow rate. The process gas control subroutine 183 is invoked by the chamber manager subroutine 177a, as are all chamber component subroutines, and receives from the chamber manager subroutine process parameters related to the desired gas flow rates. Typically, the process gas control subroutine 183 operates by opening the gas supply lines, and repeatedly (i) reading the necessary mass flow controllers, (ii) comparing the readings to the desired flow rates received from the chamber manager subroutine 177a, and (iii) adjusting the flow rates of the gas supply lines as necessary. Furthermore, the process gas control subroutine 183 includes steps for monitoring the gas flow rates for unsafe rates, and activating the safety shut-off valves when an unsafe condition is detected.

In some processes, an inert gas such as argon is flowed into the chamber 115 to stabilize the pressure in the chamber before reactive process gases are introduced into the chamber. For these processes, the process gas control subroutine 183 is programmed to include steps for flowing the inert gas into the chamber 115 for an amount of time necessary to stabilize the pressure in the chamber, and then the steps described above would be carried out. Additionally, if a process gas is to be vaporized from a liquid precursor, for example tetraethylorthosilane ("TEOS"), the process gas control subroutine 183 would be written to include steps for bubbling a delivery gas such as helium through the liquid precursor in a bubbler assembly or introducing a carrier gas such as helium to a liquid injection system. When a bubbler is used for this type of process, the process gas control subroutine 183 regulates the flow of the delivery gas, the pressure in the bubbler, and the bubbler temperature in order to obtain the desired process gas flow rates. As discussed above, the desired process gas flow rates are transferred to the process gas control subroutine 183 as process parameters. Furthermore, the process gas control subroutine 183 includes steps for obtaining the necessary delivery gas flow rate, bubbler pressure, and bubbler temperature for the desired process gas flow rate by accessing a stored table containing the necessary values for a given process gas flow rate. Once the necessary values are obtained, the delivery gas flow rate, bubbler pressure and bubbler temperature are monitored, compared to the necessary values and adjusted accordingly.

The pressure control subroutine 185 comprises program code for controlling the pressure in the chamber 115 by regulating the size of the opening of the throttle valve in the exhaust system 115 of the chamber. The size of the opening of the throttle valve is set to control the chamber pressure to the desired level in relation to the total process gas flow, size of the process chamber, and pumping setpoint pressure for the exhaust system 115. When the pressure control subroutine 185 is invoked, the desired, or target, pressure level is received as a parameter from the chamber manager subroutine 177a. The pressure control subroutine 147 operates to measure the pressure in the chamber 115 by reading one or more conventional pressure nanometers connected to the chamber, compare the measure value(s) to the target pressure, obtain PID (proportional, integral, and differential) values from a stored pressure table corresponding to the target pressure, and adjust the throttle valve according to the PID values obtained from the pressure table. Alternatively, the pressure control subroutine 185 can be written to open or close the throttle valve to a particular opening size to regulate the chamber 115 to the desired pressure.

The heater control subroutine 187 comprises program code for controlling the temperature of the lamp module that is used to heat the substrate 120. The heater control subroutine 187 is also invoked by the chamber manager subroutine 177a and receives a target, or setpoint, temperature parameter. The heater control subroutine 187 measures the temperature by measuring voltage output of a thermocouple located in a susceptor 112, compares the measured temperature to the setpoint temperature, and increases or decreases current applied to the lamp module 126 to obtain the setpoint temperature. The temperature is obtained from the measured voltage by looking up the corresponding temperature in a stored conversion table, or by calculating the temperature using a fourth order polynomial. When radiant lamps are used to heat the susceptor 112, the heater control subroutine 187 gradually controls a ramp up/down of current applied to the lamp. The gradual ramp up/down increases the life and reliability of the lamp. Additionally, a built-in fail-safe mode can be included to detect process safety compliance, and can shut down operation of the lamp module 126 if the process chamber 115 is not properly set up.

The plasma control subroutine 190 comprises program code for setting low and high frequency the RF power levels applied to the process electrodes in the chamber 115, and to set the low frequency RF frequency employed. Similar to the previously described chamber component subroutines, the plasma control subroutine 190 is invoked by the chamber manager subroutine 177a.

The above reactor description is mainly for illustrative purposes, and other CVD equipment such as electron cyclotron resonance (ECR) plasma CVD devices, induction coupled RF high density plasma CVD devices, or the like may be employed. Additionally, variations of the above described system such as variations in susceptor design, heater design, RF power frequencies, location of RF power connections and others are possible. For example, the wafer could be supported and heated by a resistively heated platen. The layer and method for forming such a layer of the present invention is not limited to any specific apparatus or to any specific excitation method.

III. Depositing Stable Tungsten Silicide Films

The method of the present invention may be employed to deposit improved $WSi_x$ films in a substrate processing chamber, such as the exemplary CVD chamber described above. The method is particularly applicable to improve characteristics of $WSi_x$ films deposited from DCS and $WF_6$ precursor gases, but may also be applied to improve characteristics of $WSi_x$ films deposited by other methods.

Figure 4:
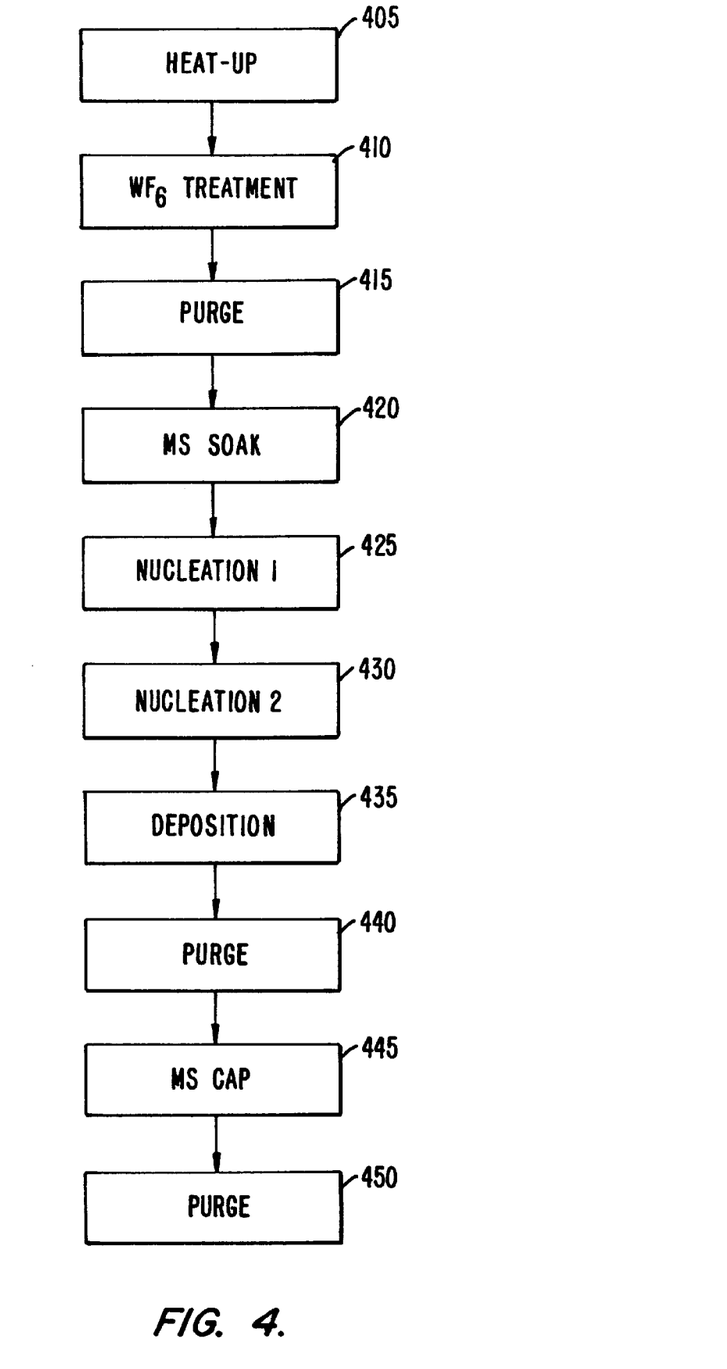
FIG. 4 is a flowchart illustrating the steps of a preferred embodiment of the present invention.

FIG. 4 illustrates a preferred process of the invention that is used to deposit a 1500 Å $WSi_x$ layer. Where applicable, reference numbers in the description below are used to refer to appropriate components of the exemplary chamber of FIGS. 3A–3D. This process is implemented and controlled using a computer program stored in the memory 38 of CVD system 10.

The first step in FIG. 4 is a heat-up step (step 405) used to heat the wafer to a processing temperature of 550° C., which is maintained throughout subsequent deposition steps (steps 410–450). Also, in step 405, argon is introduced into the chamber through gas lines 118a, 118b and 118c at a rate of 400, 400, 700 sccm, respectively, and pressure in the chamber is set to 3 torr by adjusting throttle valve 132 accordingly. Upon completion of step 405, a $WF_6$ treatment step (step 410) is employed in which a small flow of $WF_6$ (1.0 sccm) is introduced into chamber 115 for 5 seconds. This $WF_6$ treatment step is the key to the present invention. The step provides additional tungsten atoms to the surface of the substrate to reduce the amount of tungsten incorporated into the growing film. While this solution seems counterintuitive, an explanation of how it is believed to work along with experiments that prove its utility are described in more detail below.

After completion of step 410, the introduction of argon continues, but the flow of $WF_6$ is stopped in a purge step (step 415) that flushes out any remaining $WF_6$ to prevent unwanted gas reactions between $WF_6$ and the $SiH_4$, which is subsequently introduced in step 420. The purge step lasts for 10 seconds. In step 420 (the MS soak step 420), $SiH_4$ is introduced through gas line 118a at a rate of 400 sccm for 30 seconds and the flow of argon through line 118a is stopped.

Next, nucleation of the film begins and includes two separate steps: step 425 and step 430. In step 425, throttle valve 132 is opened to 50% to quickly drop the pressure from 3 torr to 1.5 torr. $WF_6$ is introduced through line 118b at a rate of 3.5 sccm and combined with argon introduced at 500 sccm. The flow of $SiH_4$ is stopped and instead, DCS is introduced through line 118a at a rate of 175 sccm, and combined with argon introduced at 300 sccm. This step lasts for 5 seconds. By step 430, pressure has reached 1.5 torr and all gas flows are continued for 15 seconds. The majority of the film is deposited in step 435. In this step, pressure is dropped further to 1.0 torr while other parameters remain unchanged. In this preferred process, deposition is carried out for 58 seconds to deposit a 1500 Å film over the substrate.

After deposition is complete a purge step (step 440) is employed for 3 seconds in which the $WF_6$ flow is stopped along with the argon flow on line 118a. The rate at which DCS is introduced on line 118a is increased to 300 sccm, and the rate at which argon is introduced on line 118b is reduced to 300 sccm. After completion of purge step 440, a 10 second MS treatment step is performed (step 445) that reduces the stress of the deposited film. The MS treatment step includes stopping the introduction of DCS; and instead introducing $SiH_4$ at a rate of 300 sccm. Finally, a final purge step (step 450) in which the flow of $SiH_4$ on line 118a replaced with a 300 sccm flow of argon and throttle valve is fully opened for 5 seconds is used to clean out the chamber. This preferred process is summarized in Table 1 below.

layer, providing additional silicon at the surface of the film interface does not accomplish this in all instances. Instead, the inventors have discovered that the tungsten content of the interfacial layer can better be reduced by providing tungsten atoms to the film interface.

The length of the $WF_6$ treatment step may vary depending on a number of factors. Preferably, the step lasts between 1 and 60 seconds, and more preferably, the step lasts between 3 and 10 seconds. Also, the rate at which $WF_6$ is introduced into the chamber may vary. Preferably, $WF_6$ is introduced at

TABLE 1

PREFERRED DCS-BASED TUNGSTEN SILICIDE PROCESS

Deposition Parameters

| Step | Description | Time (sec) | Press. (torr) | Temp. (° C.) | $WF_6$ (sccm) | DCS (sccm) | $SiH_4$ (sccm) | Ar 118a (sccm) | Ar 118b (sccm) | Ar 118c (sccm) |
|---|---|---|---|---|---|---|---|---|---|---|
| 405 | Heat-up | 30 | 3.0 | 550 | 0 | 0 | 0 | 400 | 400 | 700 |
| 410 | $WF_6$ Treat. | 5 | 3.0 | 550 | 1.0 | 0 | 0 | 400 | 400 | 700 |
| 415 | Purge | 10 | 3.0 | 550 | 0 | 0 | 0 | 400 | 400 | 700 |
| 420 | MS Soak | 30 | 3.0 | 550 | 0 | 0 | 400 | 0 | 400 | 700 |
| 425 | Nucl. 1 | 5 | 1.5 | 550 | 3.5 | 175 | 0 | 300 | 500 | 700 |
| 430 | Nucl. 2 | 15 | 1.5 | 550 | 3.5 | 175 | 0 | 300 | 500 | 700 |
| 435 | Dep. | 58 | 1.0 | 550 | 3.5 | 175 | 0 | 300 | 500 | 700 |
| 440 | Purge | 3 | 1.0 | 550 | 0 | 300 | 0 | 0 | 300 | 700 |
| 445 | MS Treat. | 10 | 1.0 | 550 | 0 | 0 | 300 | 0 | 300 | 700 |
| 450 | Purge | 5 | TVO | 550 | 0 | 0 | 0 | 300 | 300 | 700 |

The process described with respect to FIG. 4 and listed in Table 1 above is identical to a previously used $WSi_x$ process except for the addition of steps 410 (the $WF_6$ treatment step) and 415 (a purge step), which is an optional step that is not employed in all embodiments of the present invention.

As described in more detail below, the addition of step 410 results in unexpected and significantly improved film characteristics over previous $WSi_x$ layers. Specifically, films deposited according to the present invention do not exhibit an increased amount of tungsten at the film interface even when the $WSi_x$ layer is deposited over a polysilicon layer having a high phosphorus content (e.g., $2 \times 10^{20}$ atoms/cm$^3$) as do DCS $WSi_x$ layers deposited according to prior processes. Also, resistivity of the films deposited according to the present invention is relatively constant, even when a $WSi_x$ film is deposited in a chamber that had been idle for a time and not reseasoned.

While the reasons that the $WF_6$ treatment step improve these characteristics are not completely understood, it is believed that the treatment step provides a very thin layer or partial layer of tungsten atoms (maybe less than one atom thick) at the film surface. The tungsten atoms are stable and are unlikely to escape from the surface of the substrate. Thus, these tungsten atoms are available to and readily react with silicon atoms from the MS soak step (step 420), or in other embodiments, with silicon atoms from the silicon source (e.g., $SiH_4$ or DCS) used in the nucleation step(s), to form a $WSi_x$ seed layer for subsequent deposition.

Without the $WF_6$ treatment step, the MS soak step provides silicon atoms to the substrate surface. It is believed that these silicon atoms provide a base seed layer (maybe less than a couple of atoms thick) for subsequent deposition of the $WSi_x$ film. In some instances though, it is believed that the silicon atoms are not very stable by themselves and may escape from the film interface. Thus, even though it is important to reduce the tungsten content in the interfacial a rate of between 0.01 and 5 sccm. These numbers are based on deposition of the $WSi_x$ layer on a silicon oxide substrate. Preferably, the $WF_6$ flow rate and time are near the lower ranges given above when the treatment step is used for a $WSi_x$ layer deposited over polysilicon substrate. If too much $WF_6$ is introduced when a polysilicon substrate is employed, formation of a tungsten-rich layer may result. The total volume of $WF_6$ introduced into the chamber depends greatly on the substrate employed. For polysilicon substrates, the total volume of $WF_6$ introduced into the chamber is preferably between 0.1 parts per million (ppm) and 50,000 ppm in volume of the substrate processing chamber. More preferably, the amount of $WF_6$ is between 1–100 ppm or even between 7–50 ppm. The total volume for silicon oxide substrates is similar except that there is no limit to the upper range of the $WF_6$ volume. Experiments have determined that there is no problem in stabilizing the nucleation no matter how much $WF_6$ is introduced. During the treatment step, it is preferable, but not necessary, to introduce an argon carrier gas along with the $WF_6$ gas to stabilize the gas flow. The argon gas flow is preferably introduced at between 100 and 1000 sccm in a manner that equalizes the flow between gas line 118a and 118b.

In some substrate processing apparatuses it is not possible to accurately control the rate at which $WF_6$ is introduced down to a level low enough for optimal results. For example, in the exemplary system described above, the MFCs employed to control the $WF_6$ flow have minimal controllable values of 0.2 sccm and 3 seconds. For a $WF_6$ treatment step on some polysilicon substrates these parameters are not sufficient because of $WF_6$ flow rate of 0.1 sccm or lower is required to avoid formation of a tungsten-rich layer.

To achieve a sufficiently low $WF_6$ flow rate in such a system, a $WF_6$ divert step can be employed as step 410. The process parameters are the same as those previously described except that in step 410 the $WF_6$ and argon gases are diverted to the foreline rather than being introduced into the chamber and the $WF_6$ flow rate of step 410 is reduced to 0.2 sccm (the minimum controllable amount in this system). Gases are diverted to the foreline by closing valves to the chamber and opening valves to the foreline on gas line 118a and 118b. Only the bottom argon purge of 700 sccm is introduced into the chamber at this time. This step lasts for 5 seconds and fills line 118b with $WF_6$ and argon. The $WF_6$ flow is then stopped in step 415 while argon flow in the line remains unchanged.

The idea behind this divert step is to introduce a very small amount of $WF_6$ into the chamber in a consistent and controllable manner. During the $WF_6$ divert step, gas line 118b is filled with a mixture of $WF_6$ and argon. Once the flows of these gases becomes stable, the amount of $WF_6$ contained inside the gas line is constant at a selected $WF_6$ flow rate. In the purge step, the valves to the chamber are opened and the valves to the foreline are closed so that residual $WF_6$ remaining in the gas line after completion of step 410 is carried into the chamber by the argon purge flow.

In this example, the residual gas has a volume of about 100 cc, which is determined in part by the length of the gas line and the positions of the valves. Because the flow ratio of $WF_6$ to argon is 0.2/400, only 0.05 cc of $WF_6$ is actually introduced into the chamber. The initial $WF_6$ bypasses the chamber and is directed directly to the foreline. When employing such a divert step, the previously optional purge step 415 causes the $WF_6$ gas to enter the chamber. The amount of $WF_6$ introduced into the chamber can be controlled by changing the $WF_6$/Ar flow ratio in the $WF_6$ divert step. The amount can also be controlled by opening the valves to the chamber at a point in time after the gas flow on line 118b becomes stable and shortly before (e.g. 1–2 seconds) the start of purge step 415.

While the above embodiments have been described as using $WF_6$ as the tungsten source in step 410 and other steps, it is possible to use other sources of tungsten such as $WCl_6$, $WOF_4$, $WOCl_4$ and $W(CO)_6$ among others. The invention is not intended to be limited to any particular gaseous or liquid source of tungsten. Also, while the MS soak and treatment steps 420 and 445 have been illustrated with $SiH_4$ as the silicon source, it is possible to employ DCS or another silicon source instead. Additionally, the rate and ratios at which various gases are introduced and the pressure ranges, temperature ranges, process times and other deposition parameters described above with respect to the preferred process for the $WF_6$ treatment step and other steps can be varied as appropriate. Changes in these parameters effect the uniformity, stress and deposition rate of the film among other characteristics. Such changes also effect the ratio of silicon to tungsten that is incorporated in the film. Preferably the parameters are selected to deposit a film at a rate of at least 100 Å/min., and more preferably, at a deposition rate of at least 500 Å/min. Also, the values of some of these parameters, namely the ratio of DCS to $WF_6$, are selected so that the deposited $WSi_x$ film has a ratio of silicon to tungsten of between 2.0 and 2.8. When the silicon to tungsten ratio is below about 2.0 (the stoichiometry of stable tungsten silicide, $WSi_2$), the tungsten content is too high and subsequent processing steps (e.g., annealing steps) may cause delamination or other problems. Generally, the volumetric flow ratio of DCS to $WF_6$ is between about 5:1 to 400:1. Additional details of how these various parameters effect film characteristics such as the deposition rate and ratio of silicon to tungsten are described in commonly assigned U.S. Pat. No. 5,558,910, which is hereby incorporated by reference in its entirety.

Films deposited according to the method of the present invention have a fluorine content of less than $1\times10^{18}$ atoms/$cm^3$, and preferably a fluorine content of less than $1\times10^{17}$ atoms/$cm^3$. It is possible to deposit tungsten silicide films using the method of the present invention such that the films exhibit a substantially uniform silicon to tungsten ratio throughout the entire thickness of the $WSi_x$ layer. Depending on the application the $WSi_x$ layer is used for, it is common for the layer to be deposited between a thickness of 500 to 2000 Å thick. By "substantially uniform" it is meant that the average silicon to tungsten ratio within each strata of the $WSi_x$ layer is between ±10% of the average bulk value of the ratio though the thickness of the $WSi_x$ layer. Typically, the average bulk value of the ratio of silicon to tungsten is between 2.0 to 2.8. More preferably, the average value is between 2.2 and 2.6. The $WSi_x$ layer can be deposited in such a substantially uniform manner over doped or undoped polysilicon layers, doped or undoped silicon substrates and doped or undoped silicon oxide or other layers.

The process parameters set forth in Table 1 and used in the experiments below are optimized for one particular deposition process run in a lamp-heated DCS chamber manufactured by Applied Materials that is outfitted for 200 mm wafers and has a volume of 5400 cc. In addition to varying processing parameters described above to deposit $WSi_x$ layers according to specific applications, a person of ordinary skill in the art will recognize that these preferred parameters are in part chamber specific and will vary if chambers of other design and/or volume are employed.

IV. Test Results and Measurements:

While it is counterintuitive to supply tungsten atoms to the surface of the film to reduce the amount of tungsten incorporated into the film at the interface, the results of experiments performed by the inventors prove that that is indeed the result. In the experiments $WSi_x$ layers were deposited with and without the benefits of the present invention. The experiments were performed in a lamp-heated DCS chamber manufactured by Applied Materials. The chamber was outfitted for 200-mm wafers and situated in a Centura multichamber substrate processing system also manufactured by Applied Materials.

Figure 5A:
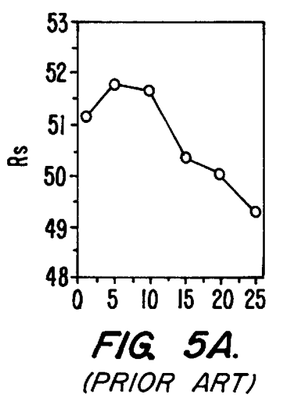
FIGS. 5A–5C and 6A–6C are graph results comparing the sheet resistance, uniformity and resistivity of $WSi_x$ films deposited according to a previously known process with the same characteristics of $WSi_x$ films deposited according to the present invention.
Figure 5B:
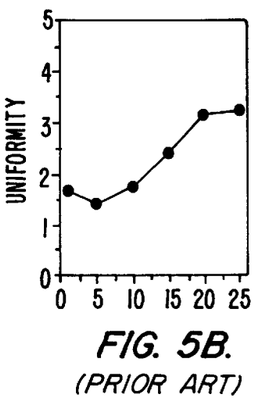
Figure 5C:
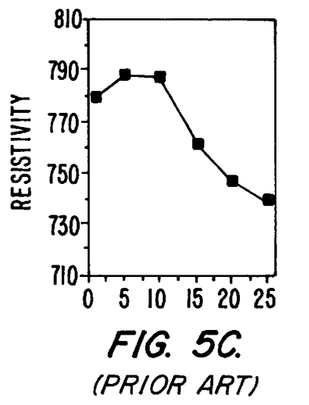
Figure 6A:
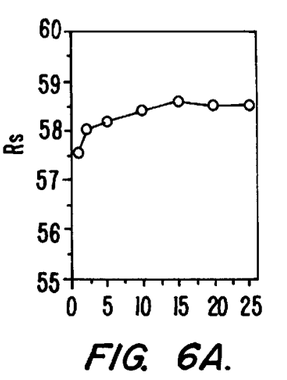
Figure 6B:
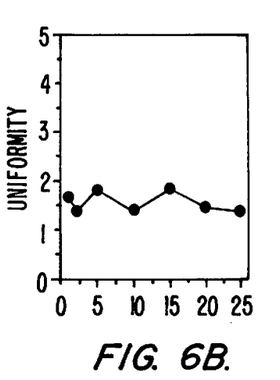
Figure 6C:
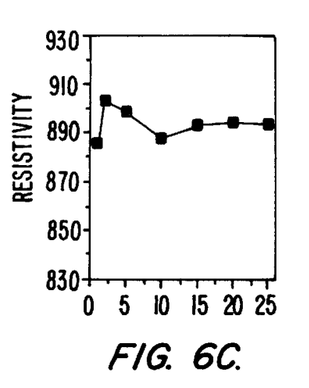

In the first experiment, $WSi_x$ films were deposited over 25 substrates using both an old and new processes. The old process differed from the new one only in that steps 410 and 415 were not performed. The results of this first experiment are shown in FIGS. 5A–C, which are graphs of the sheet resistance, uniformity and resistivity of the $WSi_x$ films deposited according to the old process and FIGS. 6A–C, which are graphs of the sheet resistance, uniformity and resistivity of the $WSi_x$ films deposited according to the present invention. As shown in FIGS. 6A–6C, sheet resistance, uniformity and resistivity of the $WSi_x$ layers deposited according to the present invention were all improved over the $WSi_x$ layers deposited according to the old process.

A comparison of FIG. 5A to FIG. 6A shows the improvement in process stability according to the present invention. In FIG. 5A, the sheet resistance (measured by a four-point probe as understood by a person of ordinary skill in the art) varied between 49 and 52 ohms/sq, while in FIG. 6A, the sheet resistance varied only 1 ohm/sq—from between 57.5 to 58.5 ohms/sq. Similarly, as evident in a comparison of FIG. 5B to FIG. 6B and FIG. 5C to FIG. 6C, both uniformity and resistivity were improved in $WSi_x$ films deposited according to the present invention. In FIGS. 5C and 6C, the higher resistivity of $WSi_x$ films deposited according to the present invention can be attributed to improvement in the Si/W ratio at the interface of these films. This was confirmed by Rutherford Backscattering Spectroscopy (RBS) analysis.

Figure 7A:
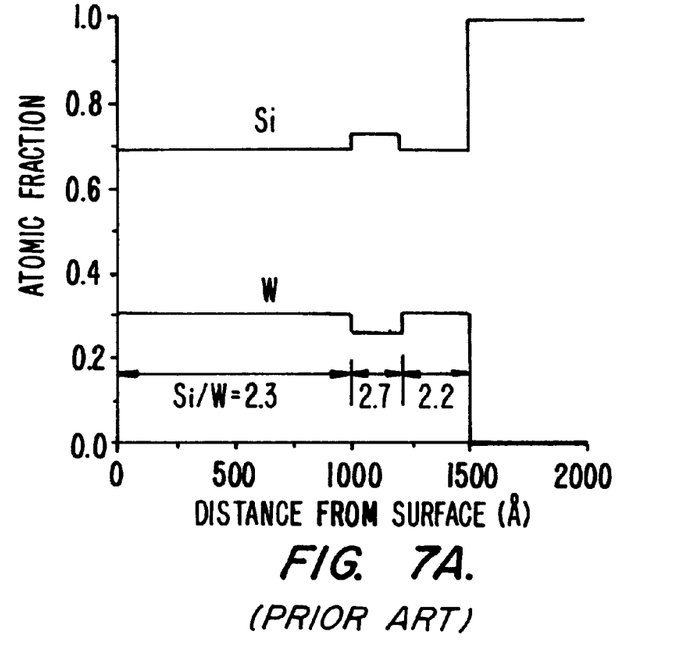
FIGS. 7A and 7B are graphs comparing the tungsten and silicon concentrations of $WSi_x$ films deposited according to a previously known process with the same characteristics of $WSi_x$ films deposited according to the present invention.
Figure 7B:
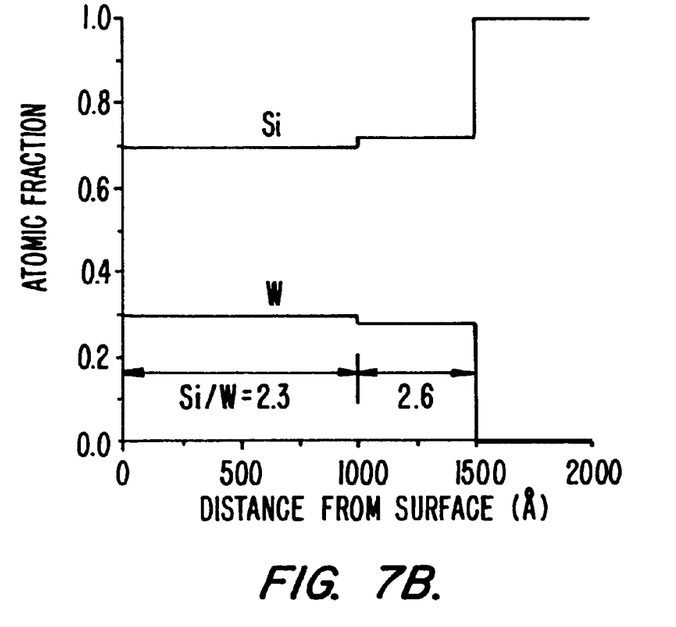

FIGS. 7A and 7B are graphs showing the ratio of silicon to tungsten in $WSi_x$ layers deposited using old and new processes, respectively. Each $WSi_x$ layer is 1500 Å thick and is deposited over a silicon substrate. As evident by a comparison of the figures, the silicon to tungsten ratio is lower in the interfacial region of the $WSi_x$ film deposited according to the old process than in the interfacial region of the film deposited according to the present invention. The atomic concentration of each strata of the films shown in FIGS. 7A and 7B and other characteristics of the films are listed below in Table 2.

TABLE 2

DCS-BASED TUNGSTEN SILICIDE FILM ANALYSIS

| Figure | Thickness (Å) | Atoms/cm$^2$ | % Si | % W | Si/W |
|---|---|---|---|---|---|
| FIG. 7A | 1000 | 5.4 × 10$^{17}$ | 0.695 | 0.305 | 2.279 |
|  | 200 | 1.07 × 10$^{17}$ | 0.73 | 0.27 | 2.704 |
|  | 300 | 1.62 × 10$^{17}$ | 0.69 | 0.31 | 2.226 |
|  | 15000 | 7.5 × 10$^{18}$ | 1.0 | 0 | — |
| FIG. 7B | 1000 | 5.39 × 10$^{17}$ | 0.7 | 0.3 | 2.333 |
|  | 400 | 2.15 × 10$^{17}$ | 0.72 | 0.28 | 2.571 |
|  | 15000 | 7.5 × 10$^{18}$ | 1.0 | 0 | — |

In another experiment, $WSi_x$ films were deposited on 7 wafers (wafers 1–7) immediately after a chamber was cleaned and seasoned and the sheet resistance of each deposited film was measured. The chamber was then run in idle mode for 14 hours before $WSi_x$ films were deposited over another 5 wafers (wafers 8–12). The sheet resistance of each of these films was also measured and is listed below in Table 3 along with the sheet resistance of the first 7 wafers.

TABLE 3

SHEET RESISTIVITY MEASUREMENTS

| Before "Idle" Period | | After "Idle" Period | |
|---|---|---|---|
| Wafer | $R_s$ | Wafer | $R_s$ |
| 1 | 56.637 | 8 | 56.598 |
| 2 | 57.237 | 9 | 57.277 |
| 3 | — | 10 | 57.442 |
| 4 | — | 11 | 57.436 |
| 5 | — | 12 | 57.702 |
| 6 | — |  |  |
| 7 | 57.572 |  |  |

The measured sheet resistance values in Table 3 indicates that the variance in sheet resistance of $WSi_x$ films deposited over wafers before the idle period was not significantly different than the variance in sheet resistance of $WSi_x$ films deposited over wafers after the idle period. Thus, even though the chamber was not reseasoned, the variance in sheet resistance was minimal.

In still another experiment, a DCS chamber was cleaned and seasoned and left to run in idle mode for 8 hours before any wafers were processed. After 8 hours, $WSi_x$ films were deposited over 6 substrates and the sheet resistance, uniformity, thickness and resistivity of each $WSi_x$ layer was measured. The results of these measurements are shown in Table 4 below.

In prior art DCS processes, film characteristics such as sheet resistance varied outside acceptable ranges after such an idle period unless the chamber was reseasoned. These two experiments indicate reseasoning is not necessary in $WSi_x$ films deposited according to the present invention.

TABLE 4

DCS-BASED TUNGSTEN SILICIDE FILM MEASUREMENTS

| Wafer | Rs | uniformity | thickness | resistivity |
|---|---|---|---|---|
| 1 | 57.459 | 1.502 | 1561 | 897 |
| 2 | 57.993 | 1.746 | 1522 | 883 |
| 3 | 57.941 | 1.434 | 1523 | 882 |
| 4 | 57.880 | 1.265 | 1531 | 886 |
| 5 | 57.795 | 1.375 | 1535 | 887 |
| 6 | 57.922 | 1.393 | 1538 | 891 |

The parameters listed in the above process and experiments should not be limiting to the claims as described herein. One of ordinary skill in the art can also use parameters and conditions other than those described with respect to the preferred embodiment. As such, the above description is illustrative and not restrictive. The scope of the invention should, therefore, be determined not with reference to the above description, but instead should be determined with reference to the appended claims along with their full scope of equivalents.

What is claimed is:

1. A process for forming a layer on a substrate, said process comprising:
    (a) forming a polysilicon layer over said substrate;
    (b) thereafter, depositing a tungsten silicide layer on said polysilicon layer in a chemical vapor deposition process by:
        (i) during a first process stage, introducing a tungsten-containing gas into a substrate processing chamber in an amount less than 5 cubic centimeters without flowing a silicon-containing source into said chamber;
        (ii) during a second process stage after said first stage, flowing a silicon-containing gas into said chamber without flowing a tungsten-containing gas; and
        (iii) during a third process stage after said second stage, flowing a process gas comprising said tungsten-containing gas and dichlorosilane into the chamber to deposit said tungsten silicide layer, wherein an average bulk ratio of silicon to tungsten in said tungsten silicide layer is between 2.0 to 2.8.

2. The process of claim 1 further comprising:
    (d) during a fourth process stage, between said first and second stages flowing an inert gas into said chamber to purge said chamber of said tungsten-containing gas.

3. The process of claim 1 wherein said tungsten-containing gas introduced during said first process stage is selected from the group consisting of $WF_6$, $WCl_6$, $WOF_4$, $WOCl_4$ and $W(CO)_6$.

4. The process of claim 1 wherein said third process stage comprises nucleation and deposition steps, wherein in said nucleation step pressure in said chamber is at a first pressure level and in said deposition step pressure in said chamber is at a second pressure that is less than said first pressure.

5. The process of claim 1 wherein said silicon-containing gas comprises $SiH_4$ or DCS.

6. The process of claim 1 wherein said first process stage limits an amount of tungsten incorporated into said tungsten silicide layer at an interface between said tungsten silicide layer and said substrate.

7. The process of claim 1 wherein said polysilicon layer is doped with phosphorus.

8. The process of claim 1 wherein said average bulk ratio of silicon to tungsten is between 2.2 and 2.6.

9. The process of claim 1 wherein said tungsten silicide layer exhibits a substantially uniform silicon to tungsten ratio throughout the entire thickness of said layer such that the average silicon to tungsten ratio within each strata of said layer is between ±10 percent of said average bulk ratio of silicon to tungsten.

10. The process of claim 1 wherein the flow of said tungsten-containing gas is diluted in a flow of argon at a ratio of at least 20:1 and introduced at a rate between 0.01 and 5.0 sccm.

11. The process of claim 10 wherein said tungsten-containing gas consists of $WF_6$.

12. The process of claim 1 wherein said amount of tungsten-containing gas introduced into said chamber during said first process stage is between 0.000167 and 5.0 cubic centimeters.

13. The process of claim 12 wherein said tungsten-containing gas consists of $WF_6$.

14. The process of claim 1 wherein said amount of tungsten-containing gas introduced into said chamber during said first process stage is between 0.0005 and 0.8333 cubic centimeters.

15. The process of claim 14 wherein said tungsten-containing gas consists of $WF_6$.

16. The process of claim 1 wherein said tungsten-containing gas consists of $WF_6$.

17. The process of claim 1 wherein said amount of tungsten-containing gas introduced into said chamber during said first process stage is less than 0.01 cubic centimeters.

18. The process of claim 17 wherein said tungsten-containing gas consists of $WF_6$.

19. A process for forming a layer on a substrate, said process comprising:
  (a) forming a polysilicon layer over said substrate;
  (b) thereafter, depositing a tungsten silicide layer on said polysilicon layer in a chemical vapor deposition process by:
    (i) during a first process stage, introducing a tungsten-containing gas into a substrate processing chamber without flowing a silicon-containing source into said chamber, wherein said first process stage introduces said tungsten-containing gas by:
      flowing said tungsten-containing gas and an inert gas into a source line that leads to said chamber while diverting said gases away from said chamber into an exhaust line; then stopping the flow of said tungsten-containing gas while maintaining said flow of said inert gas into said source line; and directing said inert gas into said chamber so that a residual amount of said tungsten-containing source within said source line is directed into said chamber;
    (ii) during a second process stage after said first stage, flowing a silicon-containing gas into said chamber without flowing a tungsten-containing gas; and
    (iii) during a third process stage after said second stage, flowing a process gas comprising said tungsten-containing gas and dichlorosilane into the chamber to deposit said tungsten silicide layer, wherein an average bulk ratio of silicon to tungsten in said tungsten silicide layer is between 2.0 to 2.8.

20. The process of claim 19 wherein said tungsten-containing gas introduced during said first process stage is flowed into said source line at a rate of about 5 sccm or less.

21. The process of claim 19 wherein said first process stage limits an amount of tungsten incorporated into said tungsten silicide layer at an interface between said tungsten silicide layer and said substrate.

22. The process of claim 19 wherein said polysilicon layer is doped with phosphorus.

23. The process of claim 19 wherein said average bulk ratio of silicon to tungsten is between 2.2 and 2.6.

24. The process of claim 19 wherein said tungsten silicide layer exhibits a substantially uniform silicon to tungsten ratio throughout the entire thickness of said layer such that the average silicon to tungsten ratio within each strata of said layer is between ±10 percent of said average bulk ratio of silicon to tungsten.

25. The process of claim 19 wherein said silicon-containing gas consists of $SiH_4$ or DCS.

26. The process of claim 19 wherein said residual amount is between 1 and 100 ppm in volume of the substrate processing chamber.

27. The process of claim 26 wherein said tungsten-containing gas consists of $WF_6$.

28. The process of claim 19 wherein said residual amount is between 7 and 50 ppm in volume of the substrate processing chamber.

29. The process of claim 28 wherein said tungsten-containing gas consists of $WF_6$.

30. The process of claim 19 wherein said tungsten-containing gas introduced during said first process stage is selected from the group consisting of $WF_6$, $WCl_6$, $WOF_4$, $WOCl_4$ and $W(CO)_6$.

31. The process of claim 19 wherein said residual amount is less than 0.01 cubic centimeters.

32. The process of claim 31 wherein said tungsten-containing gas consists of $WF_6$.

33. The process of claim 19 wherein said flow of said tungsten-containing gas and said inert gas is directed into said chamber for 2 seconds or less before stopping said flow of said tungsten-containing gas.

34. A process for forming a layer on a substrate, said process comprising:
  (a) forming a polysilicon layer over said substrate;
  (b) thereafter, depositing a tungsten silicide layer on said polysilicon layer in a chemical vapor deposition process by:
    (i) during a first process stage, introducing a tungsten-containing gas into a substrate processing chamber in an amount that provides a partial layer of tungsten atoms less than one atom thick at the film surface without flowing a silicon-containing source into said chamber;
    (ii) during a second process stage after said first stage, flowing a silicon-containing gas into said chamber without flowing a tungsten-containing gas; and
    (iii) during a third process stage after said second stage, flowing a process gas comprising said tungsten-containing gas and dichlorosilane into the chamber to deposit said tungsten silicide layer, wherein an average bulk ratio of silicon to tungsten in said tungsten silicide layer is between 2.0 to 2.8.

35. The process of claim 34 wherein said polysilicon layer is doped with phosphorus.

36. The process of claim 35 wherein said amount of tungsten-containing gas is less than 100 parts per million in chamber volume.

37. The process of claim 36 wherein said tungsten-containing gas consists of $WF_6$.

* * * * *